United States Patent
Trock et al.

(10) Patent No.: US 8,614,596 B2
(45) Date of Patent: Dec. 24, 2013

(54) SYSTEMS AND METHODS FOR INITIALIZING A VOLTAGE BUS AND MEDICAL DEVICES INCORPORATING SAME

(75) Inventors: Adam Trock, Burbank, CA (US); Jon Spurlin, Northridge, CA (US); Michael Ortega, Pasadena, CA (US); Seth Kazarians, Northridge, CA (US)

(73) Assignee: Medtronic MiniMed, Inc., Northridge, CA (US)

( * ) Notice: Subject to any disclaimer, the term of this patent is extended or adjusted under 35 U.S.C. 154(b) by 220 days.

(21) Appl. No.: 13/036,984

(22) Filed: Feb. 28, 2011

(65) Prior Publication Data
US 2012/0218023 A1 Aug. 30, 2012

(51) Int. Cl.
*H03K 3/02* (2006.01)
(52) U.S. Cl.
USPC ........... 327/198; 327/215; 327/530; 327/142; 327/143; 327/540; 320/127; 320/136; 320/166; 320/167
(58) Field of Classification Search
USPC .......... 327/198, 142, 143; 320/127–136, 166, 320/167
See application file for complete search history.

(56) References Cited

U.S. PATENT DOCUMENTS

| | | |
|---|---|---|
| 3,631,847 A | 1/1972 | Hobbs, II |
| 4,212,738 A | 7/1980 | Henne |
| 4,270,532 A | 6/1981 | Franetzki et al. |
| 4,282,872 A | 8/1981 | Franetzki et al. |
| 4,373,527 A | 2/1983 | Fischell |
| 4,395,259 A | 7/1983 | Prestele et al. |
| 4,433,072 A | 2/1984 | Pusineri et al. |
| 4,443,218 A | 4/1984 | DeCant, Jr. et al. |
| 4,494,950 A | 1/1985 | Fischell |
| 4,542,532 A | 9/1985 | McQuilkin |
| 4,550,731 A | 11/1985 | Batina et al. |
| 4,559,037 A | 12/1985 | Franetzki et al. |
| 4,562,751 A | 1/1986 | Nason et al. |
| 4,671,288 A | 6/1987 | Gough |
| 4,678,408 A | 7/1987 | Nason et al. |
| 4,685,903 A | 8/1987 | Cable et al. |
| 4,731,051 A | 3/1988 | Fischell |

(Continued)

FOREIGN PATENT DOCUMENTS

| | | |
|---|---|---|
| DE | 4329229 | 3/1995 |
| EP | 0319268 | 11/1988 |

(Continued)

OTHER PUBLICATIONS

PCT Search Report (PCT/US02/03299), Oct. 31, 2002, Medtronic Minimed, Inc.

(Continued)

*Primary Examiner* — Nguyen Tran
*Assistant Examiner* — Afework Demisse
(74) *Attorney, Agent, or Firm* — Ingrassia Fisher & Lorenz, P.C.

(57) ABSTRACT

Systems, apparatus, and methods are provided for initializing a voltage bus. An exemplary system includes an input interface, a voltage bus, discharge circuitry coupled to the voltage bus, connection circuitry coupled between the voltage bus and the input interface, and a control module coupled to the connection circuitry and the discharge circuitry. The control module activates the discharge circuitry prior to activating the connection circuitry.

31 Claims, 5 Drawing Sheets

(56) References Cited

U.S. PATENT DOCUMENTS

| | | |
|---|---|---|
| 4,731,726 A | 3/1988 | Allen, III |
| 4,781,798 A | 11/1988 | Gough |
| 4,803,625 A | 2/1989 | Fu et al. |
| 4,809,697 A | 3/1989 | Causey, III et al. |
| 4,826,810 A | 5/1989 | Aoki |
| 4,871,351 A | 10/1989 | Feingold |
| 4,898,578 A | 2/1990 | Rubalcaba, Jr. |
| 5,003,298 A | 3/1991 | Havel |
| 5,011,468 A | 4/1991 | Lundquist et al. |
| 5,019,974 A | 5/1991 | Beckers |
| 5,050,612 A | 9/1991 | Matsumura |
| 5,078,683 A | 1/1992 | Sancoff et al. |
| 5,080,653 A | 1/1992 | Voss et al. |
| 5,097,122 A | 3/1992 | Colman et al. |
| 5,100,380 A | 3/1992 | Epstein et al. |
| 5,101,814 A | 4/1992 | Palti |
| 5,108,819 A | 4/1992 | Heller et al. |
| 5,153,827 A | 10/1992 | Coutre et al. |
| 5,165,407 A | 11/1992 | Wilson et al. |
| 5,247,434 A | 9/1993 | Peterson et al. |
| 5,262,035 A | 11/1993 | Gregg et al. |
| 5,262,305 A | 11/1993 | Heller et al. |
| 5,264,104 A | 11/1993 | Gregg et al. |
| 5,264,105 A | 11/1993 | Gregg et al. |
| 5,284,140 A | 2/1994 | Allen et al. |
| 5,299,571 A | 4/1994 | Mastrototaro |
| 5,307,263 A | 4/1994 | Brown |
| 5,317,506 A | 5/1994 | Coutre et al. |
| 5,320,725 A | 6/1994 | Gregg et al. |
| 5,322,063 A | 6/1994 | Allen et al. |
| 5,338,157 A | 8/1994 | Blomquist |
| 5,339,821 A | 8/1994 | Fujimoto |
| 5,341,291 A | 8/1994 | Roizen et al. |
| 5,350,411 A | 9/1994 | Ryan et al. |
| 5,356,786 A | 10/1994 | Heller et al. |
| 5,357,427 A | 10/1994 | Langen et al. |
| 5,368,562 A | 11/1994 | Blomquist et al. |
| 5,370,622 A | 12/1994 | Livingston et al. |
| 5,371,687 A | 12/1994 | Holmes, II et al. |
| 5,376,070 A | 12/1994 | Purvis et al. |
| 5,390,671 A | 2/1995 | Lord et al. |
| 5,391,250 A | 2/1995 | Cheney, II et al. |
| 5,403,700 A | 4/1995 | Heller et al. |
| 5,411,647 A | 5/1995 | Johnson et al. |
| 5,482,473 A | 1/1996 | Lord et al. |
| 5,485,408 A | 1/1996 | Blomquist |
| 5,497,772 A | 3/1996 | Schulman et al. |
| 5,505,709 A | 4/1996 | Funderburk et al. |
| 5,543,326 A | 8/1996 | Heller et al. |
| 5,569,186 A | 10/1996 | Lord et al. |
| 5,569,187 A | 10/1996 | Kaiser |
| 5,573,506 A | 11/1996 | Vasko |
| 5,582,593 A | 12/1996 | Hultman |
| 5,586,553 A | 12/1996 | Halili et al. |
| 5,593,390 A | 1/1997 | Castellano et al. |
| 5,593,852 A | 1/1997 | Heller et al. |
| 5,594,638 A | 1/1997 | Iliff |
| 5,609,060 A | 3/1997 | Dent |
| 5,626,144 A | 5/1997 | Tacklind et al. |
| 5,630,710 A | 5/1997 | Tune et al. |
| 5,643,212 A | 7/1997 | Coutre et al. |
| 5,660,163 A | 8/1997 | Schulman et al. |
| 5,660,176 A | 8/1997 | Iliff |
| 5,665,065 A | 9/1997 | Colman et al. |
| 5,665,222 A | 9/1997 | Heller et al. |
| 5,672,952 A * | 9/1997 | Szepesi .................. 320/164 |
| 5,685,844 A | 11/1997 | Marttila |
| 5,687,734 A | 11/1997 | Dempsey et al. |
| 5,704,366 A | 1/1998 | Tacklind et al. |
| 5,750,926 A | 5/1998 | Schulman et al. |
| 5,754,111 A | 5/1998 | Garcia |
| 5,764,159 A | 6/1998 | Neftel |
| 5,772,635 A | 6/1998 | Dastur et al. |
| 5,779,665 A | 7/1998 | Mastrototaro et al. |
| 5,788,669 A | 8/1998 | Peterson |
| 5,791,344 A | 8/1998 | Schulman et al. |
| 5,800,420 A | 9/1998 | Gross et al. |
| 5,807,336 A | 9/1998 | Russo et al. |
| 5,814,015 A | 9/1998 | Gargano et al. |
| 5,822,715 A | 10/1998 | Worthington et al. |
| 5,832,448 A | 11/1998 | Brown |
| 5,840,020 A | 11/1998 | Heinonen et al. |
| 5,861,018 A | 1/1999 | Feierbach et al. |
| 5,868,669 A | 2/1999 | Iliff |
| 5,871,465 A | 2/1999 | Vasko |
| 5,879,163 A | 3/1999 | Brown et al. |
| 5,885,245 A | 3/1999 | Lynch et al. |
| 5,897,493 A | 4/1999 | Brown |
| 5,899,855 A | 5/1999 | Brown |
| 5,904,708 A | 5/1999 | Goedeke |
| 5,913,310 A | 6/1999 | Brown |
| 5,917,346 A | 6/1999 | Gord |
| 5,918,603 A | 7/1999 | Brown |
| 5,925,021 A | 7/1999 | Castellano et al. |
| 5,933,136 A | 8/1999 | Brown |
| 5,935,099 A | 8/1999 | Peterson et al. |
| 5,940,801 A | 8/1999 | Brown |
| 5,956,501 A | 9/1999 | Brown |
| 5,960,403 A | 9/1999 | Brown |
| 5,965,380 A | 10/1999 | Heller et al. |
| 5,972,199 A | 10/1999 | Heller et al. |
| 5,978,236 A | 11/1999 | Faberman et al. |
| 5,997,476 A | 12/1999 | Brown |
| 5,999,848 A | 12/1999 | Gord et al. |
| 5,999,849 A | 12/1999 | Gord et al. |
| 6,009,339 A | 12/1999 | Bentsen et al. |
| 6,032,119 A | 2/2000 | Brown et al. |
| 6,043,437 A | 3/2000 | Schulman et al. |
| 6,081,736 A | 6/2000 | Colvin et al. |
| 6,083,710 A | 7/2000 | Heller et al. |
| 6,088,608 A | 7/2000 | Schulman et al. |
| 6,101,478 A | 8/2000 | Brown |
| 6,103,033 A | 8/2000 | Say et al. |
| 6,119,028 A | 9/2000 | Schulman et al. |
| 6,120,676 A | 9/2000 | Heller et al. |
| 6,121,009 A | 9/2000 | Heller et al. |
| 6,134,461 A | 10/2000 | Say et al. |
| 6,143,164 A | 11/2000 | Heller et al. |
| 6,162,611 A | 12/2000 | Heller et al. |
| 6,175,752 B1 | 1/2001 | Say et al. |
| 6,183,412 B1 | 2/2001 | Benkowski et al. |
| 6,246,992 B1 | 6/2001 | Brown |
| 6,259,937 B1 | 7/2001 | Schulman et al. |
| 6,291,973 B1 * | 9/2001 | Lee .................. 320/128 |
| 6,329,161 B1 | 12/2001 | Heller et al. |
| 6,408,330 B1 | 6/2002 | DeLaHuerga |
| 6,424,847 B1 | 7/2002 | Mastrototaro et al. |
| 6,472,122 B1 | 10/2002 | Schulman et al. |
| 6,484,045 B1 | 11/2002 | Holker et al. |
| 6,484,046 B1 | 11/2002 | Say et al. |
| 6,485,465 B2 | 11/2002 | Moberg et al. |
| 6,503,381 B1 | 1/2003 | Gotoh et al. |
| 6,514,718 B2 | 2/2003 | Heller et al. |
| 6,544,173 B2 | 4/2003 | West et al. |
| 6,553,263 B1 | 4/2003 | Meadows et al. |
| 6,554,798 B1 | 4/2003 | Mann et al. |
| 6,558,320 B1 | 5/2003 | Causey, III et al. |
| 6,558,351 B1 | 5/2003 | Steil et al. |
| 6,560,741 B1 | 5/2003 | Gerety et al. |
| 6,565,509 B1 | 5/2003 | Say et al. |
| 6,579,690 B1 | 6/2003 | Bonnecaze et al. |
| 6,591,125 B1 | 7/2003 | Buse et al. |
| 6,592,745 B1 | 7/2003 | Feldman et al. |
| 6,605,200 B1 | 8/2003 | Mao et al. |
| 6,605,201 B1 | 8/2003 | Mao et al. |
| 6,607,658 B1 | 8/2003 | Heller et al. |
| 6,616,819 B1 | 9/2003 | Liamos et al. |
| 6,618,934 B1 | 9/2003 | Feldman et al. |
| 6,623,501 B2 | 9/2003 | Heller et al. |
| 6,641,533 B2 | 11/2003 | Causey, III et al. |
| 6,654,625 B1 | 11/2003 | Say et al. |
| 6,659,980 B2 | 12/2003 | Moberg et al. |
| 6,671,554 B2 | 12/2003 | Gibson et al. |
| 6,676,816 B2 | 1/2004 | Mao et al. |

(56) References Cited

U.S. PATENT DOCUMENTS

| | | |
|---|---|---|
| 6,689,265 B2 | 2/2004 | Heller et al. |
| 6,728,576 B2 | 4/2004 | Thompson et al. |
| 6,733,471 B1 | 5/2004 | Ericson et al. |
| 6,746,582 B2 | 6/2004 | Heller et al. |
| 6,747,556 B2 | 6/2004 | Medema et al. |
| 6,749,740 B2 | 6/2004 | Liamos et al. |
| 6,752,787 B1 | 6/2004 | Causey, III et al. |
| 6,809,653 B1 | 10/2004 | Mann et al. |
| 6,817,990 B2 | 11/2004 | Yap et al. |
| 6,881,551 B2 | 4/2005 | Heller et al. |
| 6,892,085 B2 | 5/2005 | McIvor et al. |
| 6,893,545 B2 | 5/2005 | Gotoh et al. |
| 6,895,263 B2 | 5/2005 | Shin et al. |
| 6,916,159 B2 | 7/2005 | Rush et al. |
| 6,932,584 B2 | 8/2005 | Gray et al. |
| 6,932,894 B2 | 8/2005 | Mao et al. |
| 6,942,518 B2 | 9/2005 | Liamos et al. |
| 7,153,263 B2 | 12/2006 | Carter et al. |
| 7,153,289 B2 | 12/2006 | Vasko |
| 7,396,330 B2 | 7/2008 | Banet et al. |
| 7,621,893 B2 | 11/2009 | Moberg et al. |
| 2001/0044731 A1 | 11/2001 | Coffman et al. |
| 2002/0013518 A1 | 1/2002 | West et al. |
| 2002/0055857 A1 | 5/2002 | Mault et al. |
| 2002/0082665 A1 | 6/2002 | Haller et al. |
| 2002/0137997 A1 | 9/2002 | Mastrototaro et al. |
| 2002/0161288 A1 | 10/2002 | Shin et al. |
| 2003/0060765 A1 | 3/2003 | Campbell et al. |
| 2003/0078560 A1 | 4/2003 | Miller et al. |
| 2003/0088166 A1 | 5/2003 | Say et al. |
| 2003/0144581 A1 | 7/2003 | Conn et al. |
| 2003/0152823 A1 | 8/2003 | Heller |
| 2003/0176183 A1 | 9/2003 | Drucker et al. |
| 2003/0188427 A1 | 10/2003 | Say et al. |
| 2003/0199744 A1 | 10/2003 | Buse et al. |
| 2003/0208113 A1 | 11/2003 | Mault et al. |
| 2003/0220552 A1 | 11/2003 | Reghabi et al. |
| 2004/0061232 A1 | 4/2004 | Shah et al. |
| 2004/0061234 A1 | 4/2004 | Shah et al. |
| 2004/0064133 A1 | 4/2004 | Miller et al. |
| 2004/0064156 A1 | 4/2004 | Shah et al. |
| 2004/0073095 A1 | 4/2004 | Causey, III et al. |
| 2004/0074785 A1 | 4/2004 | Holker et al. |
| 2004/0093167 A1 | 5/2004 | Braig et al. |
| 2004/0097796 A1 | 5/2004 | Berman et al. |
| 2004/0102683 A1 | 5/2004 | Khanuja et al. |
| 2004/0111017 A1 | 6/2004 | Say et al. |
| 2004/0122353 A1 | 6/2004 | Shahmirian et al. |
| 2004/0167465 A1 | 8/2004 | Mihai et al. |
| 2004/0263354 A1 | 12/2004 | Mann et al. |
| 2005/0038331 A1 | 2/2005 | Silaski et al. |
| 2005/0038680 A1 | 2/2005 | McMahon et al. |
| 2005/0154271 A1 | 7/2005 | Rasdal et al. |
| 2005/0192557 A1 | 9/2005 | Brauker et al. |
| 2006/0229694 A1 | 10/2006 | Schulman et al. |
| 2006/0238333 A1 | 10/2006 | Welch et al. |
| 2006/0293571 A1 | 12/2006 | Bao et al. |
| 2007/0088521 A1 | 4/2007 | Shmueli et al. |
| 2007/0135866 A1 | 6/2007 | Baker et al. |
| 2008/0154503 A1 | 6/2008 | Wittenber et al. |
| 2009/0081951 A1 | 3/2009 | Erdmann et al. |
| 2009/0082635 A1 | 3/2009 | Baldus et al. |
| 2009/0268354 A1* | 10/2009 | Kaplan ............... 361/15 |
| 2010/0052619 A1* | 3/2010 | Bishop et al. ............... 320/136 |
| 2010/0102638 A1* | 4/2010 | Chen et al. ............... 307/100 |
| 2011/0133546 A1* | 6/2011 | Jang et al. ............... 307/9.1 |
| 2012/0218023 A1* | 8/2012 | Trock et al. ............... 327/401 |

FOREIGN PATENT DOCUMENTS

| | | |
|---|---|---|
| EP | 0806738 | 11/1997 |
| EP | 0880936 | 12/1998 |
| EP | 1338295 | 8/2003 |
| EP | 1631036 A2 | 3/2006 |
| GB | 2218831 | 11/1989 |
| WO | WO 96/20745 | 7/1996 |
| WO | WO 96/36389 | 11/1996 |
| WO | WO 96/37246 A1 | 11/1996 |
| WO | WO 97/21456 | 6/1997 |
| WO | WO 98/20439 | 5/1998 |
| WO | WO 98/24358 | 6/1998 |
| WO | WO 98/42407 | 10/1998 |
| WO | WO 98/49659 | 11/1998 |
| WO | WO 98/59487 | 12/1998 |
| WO | WO 99/08183 | 2/1999 |
| WO | WO 99/10801 | 3/1999 |
| WO | WO 99/18532 | 4/1999 |
| WO | WO 99/22236 | 5/1999 |
| WO | WO 00/10628 | 3/2000 |
| WO | WO 00/19887 | 4/2000 |
| WO | WO 00/48112 | 8/2000 |
| WO | WO 02/058537 A2 | 8/2002 |
| WO | WO 03/001329 | 1/2003 |
| WO | WO 03/094090 | 11/2003 |
| WO | WO 2005/065538 A2 | 7/2005 |

OTHER PUBLICATIONS (Animas Corporation, 1999). Animas . . . bringing new life to insulin therapy.

Bode B W, et al. (1996). Reduction in Severe Hypoglycemia with Long-Term Continuous Subcutaneous Insulin Infusion in Type I Diabetes. Diabetes Care, vol. 19, No. 4, 324-327.

Boland E (1998). Teens Pumping it Up! Insulin Pump Therapy Guide for Adolescents. 2nd Edition.

Brackenridge B P (1992). Carbohydrate Gram Counting a Key to Accurate Mealtime Boluses in Intensive Diabetes Therapy. Practical Diabetology, vol. 11, No. 2, pp. 22-28.

Brackenridge, B P et al. (1995). Counting Carbohydrates How to Zero in on Good Control. MiniMed Technologies Inc.

Farkas-Hirsch R et al. (1994). Continuous Subcutaneous Insulin Infusion: A Review of the Past and Its Implementation for the Future. Diabetes Spectrum From Research to Practice, vol. 7, No. 2, pp. 80-84, 136-138.

Hirsch I B et al. (1990). Intensive Insulin Therapy for Treatment of Type I Diabetes. Diabetes Care, vol. 13, No. 12, pp. 1265-1283.

Kulkarni K et al. (1999). Carbohydrate Counting a Primer for Insulin Pump Users to Zero in on Good Control. MiniMed Inc.

Marcus A O et al. (1996). Insulin Pump Therapy Acceptable Alternative to Injection Therapy. Postgraduate Medicine, vol. 99, No. 3, pp. 125-142.

Reed J et al. (1996). Voice of the Diabetic, vol. 11, No. 3, pp. 1-38.

Skyler J S (1989). Continuous Subcutaneous Insulin Infusion [CSII] With External Devices: Current Status. Update in Drug Delivery Systems, Chapter 13, pp. 163-183. Futura Publishing Company.

Skyler J S et al. (1995). The Insulin Pump Therapy Book Insights from the Experts. MiniMed•Technologies.

Strowig S M (1993). Initiation and Management of Insulin Pump Therapy. The Diabetes Educator, vol. 19, No. 1, pp. 50-60.

Walsh J, et al. (1989). Pumping Insulin: The Art of Using an Insulin Pump. Published by MiniMed•Technologies.

(Intensive Diabetes Management, 1995). Insulin Infusion Pump Therapy. pp. 66-78.

Disetronic My Choice™ D-TRON™ Insulin Pump Reference Manual. (no date).

Disetronic H-TRON® plus Quick Start Manual. (no date).

Disetronic My Choice H-TRONplus Insulin Pump Reference Manual. (no date).

Disetronic H-TRON® plus Reference Manual. (no date).

(MiniMed, 1996). The MiniMed 506. 7 pages. Retrieved on Sep. 16, 2003 from the World Wide Web: http://web.archive.org/web/19961111054527/www.minimed.com/files/506_pic.htm.

(MiniMed, 1997). MiniMed 507 Specifications. 2 pages. Retrieved on Sep. 16, 2003 from the World Wide Web: http://web.archive.org/web/19970124234841/www.minimed.com/files/mmn075.htm.

(MiniMed, 1996). FAQ: The Practical Things . . . pp. 1-4. Retrieved on Sep. 16, 2003 from the World Wide Web: http://web.archive.org/web/19961111054546/www.minimed.com/files/faq_pract.htm.

(56) References Cited

OTHER PUBLICATIONS (MiniMed, 1997). Wanted: a Few Good Belt Clips! 1 page. Retrieved on Sep. 16, 2003 from the World Wide Web: http://web.archive.org/web/19970124234559/www.minimed.com/files/mmn002.htm.

(MiniMed Technologies, 1994). MiniMed 506 Insulin Pump User's Guide.

(MiniMed Technologies, 1994). MiniMed™ Dosage Calculator Initial Meal Bolus Guidelines / MiniMed™ Dosage Calculator Initial Basal Rate Guidelines Percentage Method. 4 pages.

(MiniMed, 1996). MiniMed™ 507 Insulin Pump User's Guide.

(MiniMed, 1997). MiniMed™ 507 Insulin Pump User's Guide.

(MiniMed, 1998). MiniMed 507C Insulin Pump User's Guide.

(MiniMed International, 1998). MiniMed 507C Insulin Pump for those who appreciate the difference.

(MiniMed Inc., 1999). MiniMed 508 Flipchart Guide to Insulin Pump Therapy.

(MiniMed Inc., 1999). Insulin Pump Comparison / Pump Therapy Will Change Your Life.

(MiniMed, 2000). MiniMed® 508 User's Guide.

(MiniMed Inc., 2000). MiniMed® Now [I] Can Meal Bolus Calculator / MiniMed® Now [I] Can Correction Bolus Calculator.

(MiniMed Inc., 2000). Now [I] Can MiniMed Pump Therapy.

(MiniMed Inc., 2000). Now [I] Can MiniMed Diabetes Management.

(Medtronic MiniMed, 2002). The 508 Insulin Pump A Tradition of Excellence.

(Medtronic MiniMed, 2002). Medtronic MiniMed Meal Bolus Calculator and Correction Bolus Calculator. International Version.

Abel, P., et al., "Experience with an implantable glucose sensor as a prerequiste of an artificial beta cell," Biomed. Biochim. Acta 43 (1984) 5, pp. 577-584.

Bindra, Dilbir S., et al., "Design and in Vitro Studies of a Needle-Type Glucose Sensor for a Subcutaneous Monitoring," American Chemistry Society, 1991, 63, pp. 1692-1696.

Boguslavsky, Leonid, et al., "Applications of redox polymers in biosensors," Sold State Ionics 60, 1993, pp. 189-197.

Geise, Robert J., et al., "Electropolymerized 1,3-diaminobenzene for the construction of a 1,1'-dimethylferrocene mediated glucose biosensor," Analytica Chimica Acta, 281, 1993, pp. 467-473.

Gernet, S., et al., "A Planar Glucose Enzyme Electrode," Sensors and Actuators, 17, 1989, pp. 537-540.

Gernet, S., et al., "Fabrication and Characterization of a Planar Electromechanical Cell and its Application as a Glucose Sensor," Sensors and Actuators, 18, 1989, pp. 59-70.

Gorton, L., et al., "Amperometric Biosensors Based on an Apparent Direct Electron Transfer Between Electrodes and Immobilized Peroxiases," Analyst, Aug. 1991, vol. 117, pp. 1235-1241.

Gorton, L., et al., "Amperometric Glucose Sensors Based on Immobilized Glucose-Oxidizing Enymes and Chemically Modified Electrodes," Analytica Chimica Acta, 249, 1991, pp. 43-54.

Gough, D. A., et al., "Two-Dimensional Enzyme Electrode Sensor for Glucose," Analytical Chemistry, vol. 57, No. 5, 1985, pp. 2351-2357.

Gregg, Brian A., et al., "Cross-Linked Redox Gels Containing Glucose Oxidase for Amperometric Biosensor Applications," Analytical Chemistry, 62, pp. 258-263.

Gregg, Brian A., et al., "Redox Polymer Films Containing Enzymes. 1. A Redox-Conducting Epoxy Cement: Synthesis, Characterization, and Electrocatalytic Oxidation of Hydroquinone," The Journal of Physical Chemistry, vol. 95, No. 15, 1991, pp. 5970-5975.

Hashiguchi, Yasuhiro, MD, et al., "Development of a Miniaturized Glucose Monitoring System by Combining a Needle-Type Glucose Sensor With Microdialysis Sampling Method," Diabetes Care, vol. 17, No. 5, May 1994, pp. 387-389.

Heller, Adam, "Electrical Wiring of Redox Enzymes," Acc. Chem. Res., vol. 23, No. 5, May 1990, pp. 128-134.

Jobst, Gerhard, et al., "Thin-Film Microbiosensors for Glucose-Lactate Monitoring," Analytical Chemistry, vol. 68, No. 18, Sep. 15, 1996, pp. 3173-3179.

Johnson, K.W., et al., "In vivo evaluation of an electroenzymatic glucose sensor implanted in subcutaneous tissue," Biosensors & Bioelectronics, 7, 1992, pp. 709-714.

Jönsson, G., et al., "An Electromechanical Sensor for Hydrogen Peroxide Based on Peroxidase Adsorbed on a Spectrographic Graphite Electrode," Electroanalysis, 1989, pp. 465-468.

Kanapieniene, J. J., et al., "Miniature Glucose Biosensor with Extended Linearity," Sensors and Actuators, B. 10, 1992, pp. 37-40.

Kawamori, Ryuzo, et al., "Perfect Normalization of Excessive Glucagon Responses to Intraveneous Arginine in Human Diabetes Mellitus With the Artificial Beta-Cell," Diabetes vol. 29, Sep. 1980, pp. 762-765.

Kimura, J., et al., "An Immobilized Enzyme Membrane Fabrication Method," Biosensors 4, 1988, pp. 41-52.

Koudelka, M., et al., "In-vivo Behaviour of Hypodermically Implanted Microfabricated Glucose Sensors," Biosensors & Bioelectronics 6, 1991, pp. 31-36.

Koudelka, M., et al., "Planar Amperometric Enzyme-Based Glucose Microelectrode," Sensors & Actuators, 18, 1989, pp. 157-165.

Mastrototaro, John J., et al., "An electroenzymatic glucose sensor fabricated on a flexible substrate," Sensors & Actuators, B. 5, 1991, pp. 139-144.

Mastrototaro, John J., et al., "An Electroenzymatic Sensor Capable of 72 Hour Continuous Monitoring of Subcutaneous Glucose," 14th Annual International Diabetes Federation Congress, Washington D.C., Jun. 23-28, 1991.

McKean, Brian D., et al., "A Telemetry-Instrumentation System for Chronically Implanted Glucose and Oxygen Sensors," IEEE Transactions on Biomedical Engineering, Vo. 35, No. 7, Jul. 1988, pp. 526-532.

Monroe, D., "Novel Implantable Glucose Sensors," ACL, Dec. 1989, pp. 8-16.

Morff, Robert J., et al., "Microfabrication of Reproducible, Economical, Electroenzymatic Glucose Sensors," Annuaal International Conference of teh IEEE Engineering in Medicine and Biology Society, Vo. 12, No. 2, 1990, pp. 483-484.

Moussy, Francis, et al., "Performance of Subcutaneously Implanted Needle-Type Glucose Sensors Employing a Novel Trilayer Coating," Analytical Chemistry, vol. 65, No. 15, Aug. 1, 1993, pp. 2072-2077.

Nakamoto, S., et al., "A Lift-Off Method for Patterning Enzyme-Immobilized Membranes in Multi-Biosensors," Sensors and Actuators 13, 1988, pp. 165-172.

Nishida, Kenro, et al., "Clinical applications of teh wearable artifical endocrine pancreas with the newly designed needle-type glucose sensor," Elsevier Sciences B.V., 1994, pp. 353-358.

Nishida, Kenro, et al., "Development of a ferrocene-mediated needle-type glucose sensor covereed with newly designd biocompatible membrane, 2-methacryloyloxyethylphosphorylcholine-co-n-butyl nethacrylate," Medical Progress Through Technology, vol. 21, 1995, pp. 91-103.

Poitout, V., et al., "A glucose monitoring system for on line estimation oin man of blood glucose concentration using a miniaturized glucose sensor implanted in the subcutaneous tissue adn a wearable control unit," Diabetologia, vol. 36, 1991, pp. 658-663.

Reach, G., "A Method for Evaluating in vivo the Functional Characteristics of Glucose Sensors," Biosensors 2, 1986, pp. 211-220.

Shaw, G. W., et al., "In vitro testing of a simply constructed, highly stable glucose sensor suitable for implantation in diabetic patients," Biosensors & Bioelectronics 6, 1991, pp. 401-406.

Shichiri, M., "A Needle-Type Glucose Sensor—A Valuable Tool Not Only for a Self-Blood Glucose Monitoring but for a Wearable Artifiical Pancreas," Life Support Systems Proceedings, XI Annual Meeting ESAO, Alpbach-Innsbruck, Austria, Sep. 1984, pp. 7-9.

Shichiri, Motoaki, et al., "An artificial endocrine pancreas—problems awaiting solution for long-term clinical applications of a glucose sensor," Frontiers Med. Biol. Engng., 1991, vol. 3, No. 4, pp. 283-292.

Shichiri, Motoaki, et al., "Closed-Loop Glycemic Control with a Wearable Artificial Endocrine Pancreas—Variations in Daily Insulin Requirements to Glycemic Response," Diabetes, vol. 33, Dec. 1984, pp. 1200-1202.

(56) References Cited

OTHER PUBLICATIONS

Shichiri, Motoaki, et al., "Glycaemic Control in a Pacreatectomized Dogs with a Wearable Artificial Endocrine Pancreas," Diabetologia, vol. 24, 1983, pp. 179-184.

Shichiri, M., et al., "In Vivo Characteristics of Needle-Type Glucose Sensor—Measurements of Subcutaneous Glucose Concentrations in Human Volunteers," Hormone and Metabolic Research, Supplement Series vol. No. 20, 1988, pp. 17-20.

Shichiri, M., et al., "Membrane design for extending the long-life of an implantable glucose sensor," Diab. Nutr. Metab., vol. 2, No. 4, 1989, pp. 309-313.

Shichiri, Motoaki, et al., "Normalization of the Paradoxic Secretion of Glucagon in Diabetes Who Were Controlled by the Artificial Beta Cell," Diabetes, vol. 28, Apr. 1979, pp. 272-275.

Shichiri, Motoaki, et al., "Telemetry Glucose Monitoring Device with Needle-Type Glucose Sensor: A useful Tool for Blood Glucose Monitoring in Diabetic Individuals," Diabetes Care, vol. 9, No. 3, May-Jun. 1986, pp. 298-301.

Shichiri, Motoaki, et al., "Wearable Artificial Endocrine Pancreas with Needle-Type Glucose Sensor," The Lancet, Nov. 20, 1982, pp. 1129-1131.

Shichiri, Motoaki, et al., "The Wearable Artificial Endocrine Pancreas with a Needle-Type Glucose Sensor: Perfect Glycemic Control in Ambulatory Diabetes," Acta Paediatr Jpn 1984, vol. 26, pp. 359-370.

Shinkai, Seiji, "Molecular Recognitiion of Mono- and Di-saccharides by Phenylboronic Acids in Solvent Extraction and as a Monolayer," J. Chem. Soc., Chem. Commun., 1991, pp. 1039-1041.

Shults, Mark C., "A Telemetry-Instrumentation System for Monitoring Multiple Subcutaneously Implanted Glucose Sensors," IEEE Transactions on Biomedical Engineering, vol. 41, No. 10, Oct. 1994, pp. 937-942.

Sternberg, Robert, et al., "Study and Development of Multilayer Needle-type Enzyme-based Glucose Microsensors," Biosensors, vol. 4, 1988, pp. 27-40.

Tamiya, E., et al., "Micro Glucose Sensors using Electron Mediators Immobilized on a Polypyrrole-Modified Electrode," Sensors and Actuators, vol. 18, 1989, pp. 297-307.

Tsukagoshi, Kazuhiko, et al., "Specific Complexation with Mono- and Disaccharides that can be Detected by Circular Dichroism," J. Org. Chem., vol. 56, 1991, pp. 4089-4091.

Urban, G., et al., "Miniaturized multi-enzyme biosensors integrated with pH sensors on flexible polymer carriers for in vivo applciations," Biosensors & Bioelectronics, vol. 7, 1992, pp. 733-739.

Ubran, G., et al., "Miniaturized thin-film biosensors using covalently immobilized glucose oxidase," Biosensors & Bioelectronics, vol. 6, 1991, pp. 555-562.

Velho, G., et al., "In vivo calibration of a subcutaneous glucose sensor for determination of subcutaneous glucose kinetics," Diab. Nutr. Metab., vol. 3, 1988, pp. 227-233.

Wang, Joseph, et al., "Needle-Type Dual Microsensor for the Simultaneous Monitoring of Glucose and Insulin," Analytical Chemistry, vol. 73, 2001, pp. 844-847.

Yamasaki, Yoshimitsu, et al., "Direct Measurement of Whole Blood Glucose by a Needle-Type Sensor," Clinics Chimica Acta, vol. 93, 1989, pp. 93-98.

Yokoyama, K., "Integrated Biosensor for Glucose and Galactose," Analytica Chimica Acta, vol. 218, 1989, pp. 137-142.

\* cited by examiner

SYSTEMS AND METHODS FOR INITIALIZING A VOLTAGE BUS AND MEDICAL DEVICES INCORPORATING SAME

TECHNICAL FIELD

Embodiments of the subject matter described herein relate generally to medical devices, and more particularly, relate to initializing a voltage bus in a portable medical device.

BACKGROUND

Portable medical devices are useful for patients that have conditions that must be monitored on a continuous or frequent basis. For example, diabetics are usually required to modify and monitor their daily lifestyle to keep their blood glucose (BG) in balance. Individuals with Type 1 diabetes and some individuals with Type 2 diabetes use insulin to control their BG levels. To do so, diabetics routinely keep strict schedules, including ingesting timely nutritious meals, partaking in exercise, monitoring BG levels daily, and adjusting and administering insulin dosages accordingly.

The prior art includes a number of fluid infusion devices and insulin pump systems that are designed to deliver accurate and measured doses of insulin via infusion sets (an infusion set delivers the insulin through a small diameter tube that terminates at, e.g., a cannula inserted under the patient's skin). In lieu of a syringe, the patient can simply activate the insulin pump to administer an insulin bolus as needed, for example, in response to the patient's high BG level.

A typical infusion pump includes a housing, which encloses a pump drive system, a fluid containment assembly, an electronics system, and a power supply. The pump drive system typically includes a small motor (DC, stepper, solenoid, or other varieties) and drive train components such as gears, screws, and levers that convert rotational motor motion to a translational displacement of a stopper in a reservoir. The fluid containment assembly typically includes the reservoir with the stopper, tubing, and a catheter or infusion set to create a fluid path for carrying medication from the reservoir to the body of a user. The electronics system regulates power from the power supply to the motor. The electronics system may also include programmable controls to operate the motor continuously or at periodic intervals to obtain a closely controlled and accurate delivery of the medication over an extended period, or may incorporate sensors and alarm features designed to detect and indicate certain operating conditions, such as non-delivery of the medication to the patient due to a fluid path occlusion. In practice, the individual components of the electronics system operate off a common voltage bus that provides a supply voltage for the components of the electronics system.

BRIEF SUMMARY

An embodiment of an electronics system is provided. The system includes an input interface, a voltage bus, discharge circuitry coupled to the voltage bus, connection circuitry coupled between the voltage bus and the input interface, and a control module coupled to the connection circuitry and the discharge circuitry. The control module activates the discharge circuitry prior to activating the connection circuitry.

Another embodiment is provided for a method of initializing a voltage bus. The method involves identifying a connection condition indicative of a desire to provide a power supply voltage from a power supply to the voltage bus, discharging the voltage bus in response to identifying the connection condition, and after discharging the voltage bus, activating connection circuitry coupled between the power supply and the voltage bus to provide the power supply voltage to the voltage bus.

Also provided is an embodiment of a portable medical device. The portable medical device includes an interface to be coupled to a power supply and an electronics system. The electronics system includes a voltage bus, connection circuitry coupled between the voltage bus and the interface, discharge circuitry coupled to the voltage bus, and a control module coupled to the connection circuitry and the discharge circuitry. The control module identifies a connection condition indicative of a desire to provide a power supply voltage from the power supply to the voltage bus, and in response to identifying the connection condition, activates the discharge circuitry for a first time period to discharge the voltage bus, and thereafter activates the connection circuitry to provide the power supply voltage to the voltage bus.

Another embodiment of a method for initializing a voltage bus of a portable medical device is provided. This embodiment involves identifying a connection condition, and in response to identifying the connection condition when the bus voltage is greater than a first threshold voltage, activating connection circuitry coupled between a power supply and the voltage bus. In response to identifying the connection condition when the bus voltage is less than the first threshold voltage, the method involves discharging the voltage bus until the bus voltage is less than a second threshold voltage, and activating the connection circuitry after the bus voltage is less than the second threshold voltage.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter described herein may be described in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description may refer to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. In addition, certain terminology may also be used in the following description for the purpose of reference only, and thus are not intended to be limiting. For example, terms such as "first", "second", and other such numerical terms referring to structures do not imply a sequence or order unless clearly indicated by the context.

The technologies described below can be implemented in any electronic device having a voltage bus that routes or otherwise provides voltage to one or more components of the electronic device. Although the subject matter is applicable to any electronic device, the exemplary embodiments are implemented in the form of medical devices, such as portable electronic medical devices. Although many different applications are possible, the following description focuses on a fluid infusion device, such as an infusion pump, as part of an infusion system deployment. For the sake of brevity, conventional techniques related to infusion system operation, insulin pump and/or infusion set operation, and other functional aspects of the systems (and the individual operating components of the systems) may not be described in detail here. Examples of infusion pumps may be of the type described in, but not limited to, U.S. Pat. Nos. 4,562,751; 4,678,408; 4,685,903; 5,080,653; 5,505,709; 5,097,122; 6,485,465; 6,554,798; 6,558,320; 6,558,351; 6,641,533; 6,659,980; 6,752,787; 6,817,990; 6,932,584; and 7,621,893 which are herein incorporated by reference.

Figure 1:
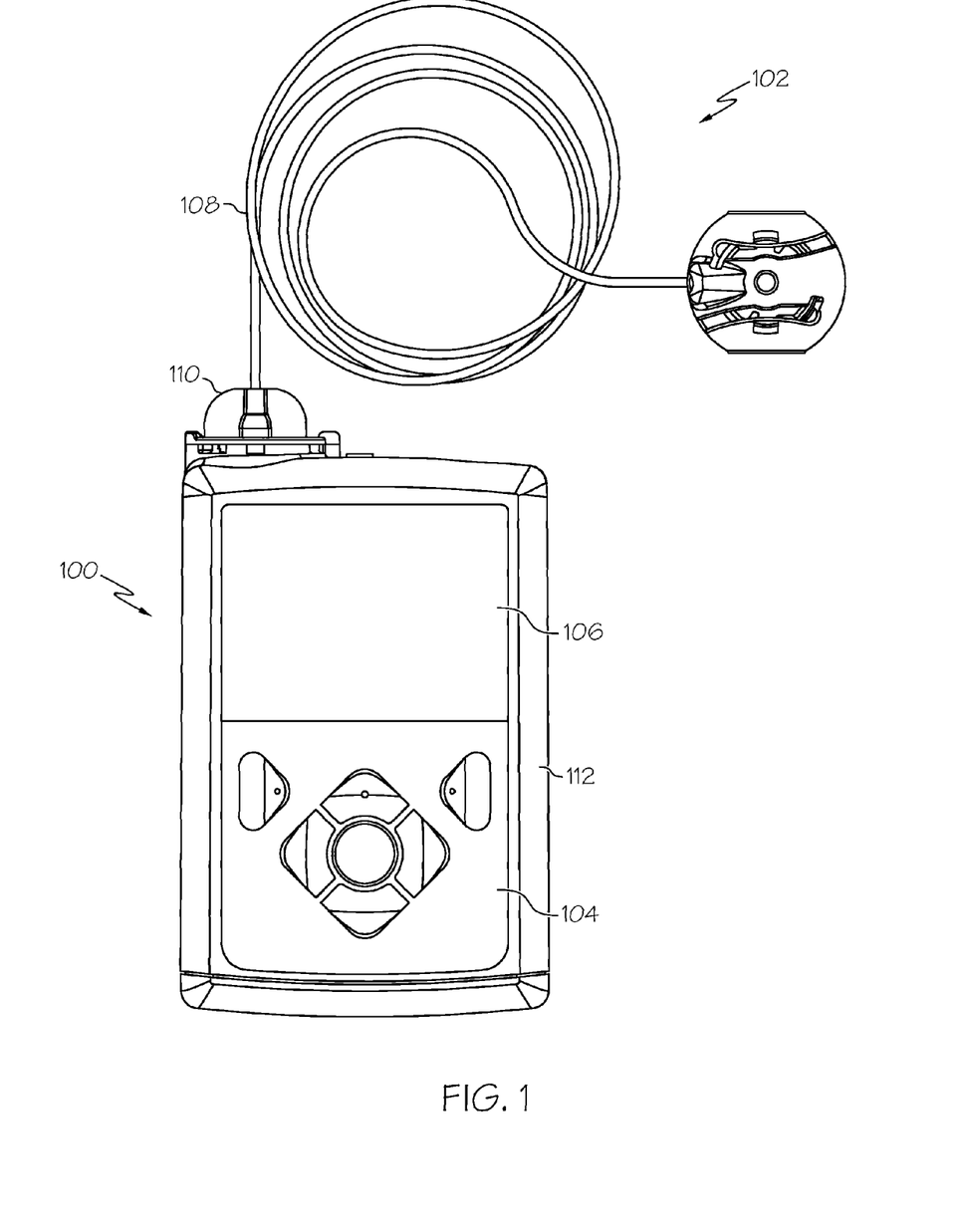
FIG. 1 is a plan view of an embodiment of a fluid infusion device.

FIG. 1 depicts an exemplary embodiment of a portable medical device 100. As set forth above, in the illustrated embodiment, the portable medical device 100 is realized as a fluid infusion device (or infusion pump) suitable for infusing fluid, such as insulin, into the body of a user. In the illustrated embodiment, the infusion pump 100 is designed to be carried or worn by the patient, and the infusion pump 100 is configured to be interoperable with an infusion set 102 (e.g., a small diameter tube such as a cannula or the like inserted under the patient's skin) that is coupled to the infusion pump 100 as part of an insulin infusion system. The components of an insulin infusion system may be realized using different platforms, designs, and configurations, and the infusion pump 100 may leverage a number of conventional features, components, elements, and characteristics of existing fluid infusion devices.

The illustrated embodiment of the infusion pump 100 in FIG. 1 includes a user interface 104 that includes several buttons that can be activated by the user. These buttons can be used to administer a bolus of insulin, to change therapy settings, to change user preferences, to select display features, and the like. As described in greater detail below, in accordance with one or more embodiments, the user interface 104 may also include one or more user interface element (e.g., a button, switch, or the like) to allow a user to indicate a desire to turn on or turn off the infusion pump 100.

Although not required, the illustrated embodiment of the infusion pump 100 also includes a display element 106, which may be realized as a liquid crystal display (LCD) or another suitable display element that leverages other display technologies, such as, for example, plasma or thin film transistor (TFT) display technologies. In some embodiments, the display element 106 is realized as a touch screen display element that also serves as a user interface component.

In exemplary embodiments, the housing 112 of the infusion pump 100 is formed from a substantially rigid material having a hollow interior adapted to allow a fluid reservoir to be disposed therein. The fluid reservoir may be realized as a syringe, a vial, a cartridge, a bag, or the like, that contains the fluid to be delivered to the user, and a length of tubing 108 is coupled between the fluid reservoir and the infusion set 102 to facilitate a fluid path from the fluid reservoir to the body of a user via the tubing 108 and infusion set 102. The housing 112 accommodates a removable cap or fitting 110, which is suitably sized and configured to allow replacement of fluid reservoirs (which are typically disposable) as needed. In this regard, the fitting 110 is designed to accommodate the fluid path from the fluid reservoir to the tubing 108. In certain embodiments, the infused fluid contained within the fluid reservoir is insulin, although many other fluids may be administered through infusion such as, but not limited to, HIV drugs, drugs to treat pulmonary hypertension, iron chelation drugs, pain medications, anti-cancer treatments, medications, vitamins, hormones, or the like.

In an exemplary embodiment, the infusion pump 100 includes an electronics assembly, a drive motor assembly, and a power supply that are disposed within the hollow interior of the housing 112, and accordingly, these interior components hidden from view by the housing 112 and are not shown in FIG. 1. The electronics assembly interfaces with or is otherwise coupled to each of the drive motor assembly, the power supply, the display element 106, and/or user interface 104, and the electronics assembly contains components of an electronics system (see FIG. 2 and related description below) configured to support or otherwise control operation of the infusion pump 100. For example, the electronics system may include one or more electronic components configured to maintain information pertaining to a delivery profile for administering fluid to a user in accordance with a predetermined schedule, operate the drive motor assembly to displace a plunger inside the fluid reservoir to deliver fluid to the user via infusion set 102 in accordance with the delivery profile, and/or present various types of information or data to the user on the display element 106, such as, without limitation: physiological patient data (e.g., the current glucose level of the patient, a graph or chart of the patient's glucose level versus time, or the like), status information, clock information, device status indicators, alarms, alerts, and/or other information and data received or processed by the electronics system.

In practical embodiments, the housing 112 of the infusion pump 100 is adapted to provide an opening that accommodates insertion and/or removal of the power supply, such as one or more batteries or a battery pack. As described in greater detail below in the context of FIG. 2, the power supply interfaces with the electronics assembly to provide a supply voltage to the electronics system and support operation of the infusion pump 100. In some embodiments, the power supply may also interface with the drive motor assembly to provide operating power to an electric motor of the drive motor assembly.

Figure 2:
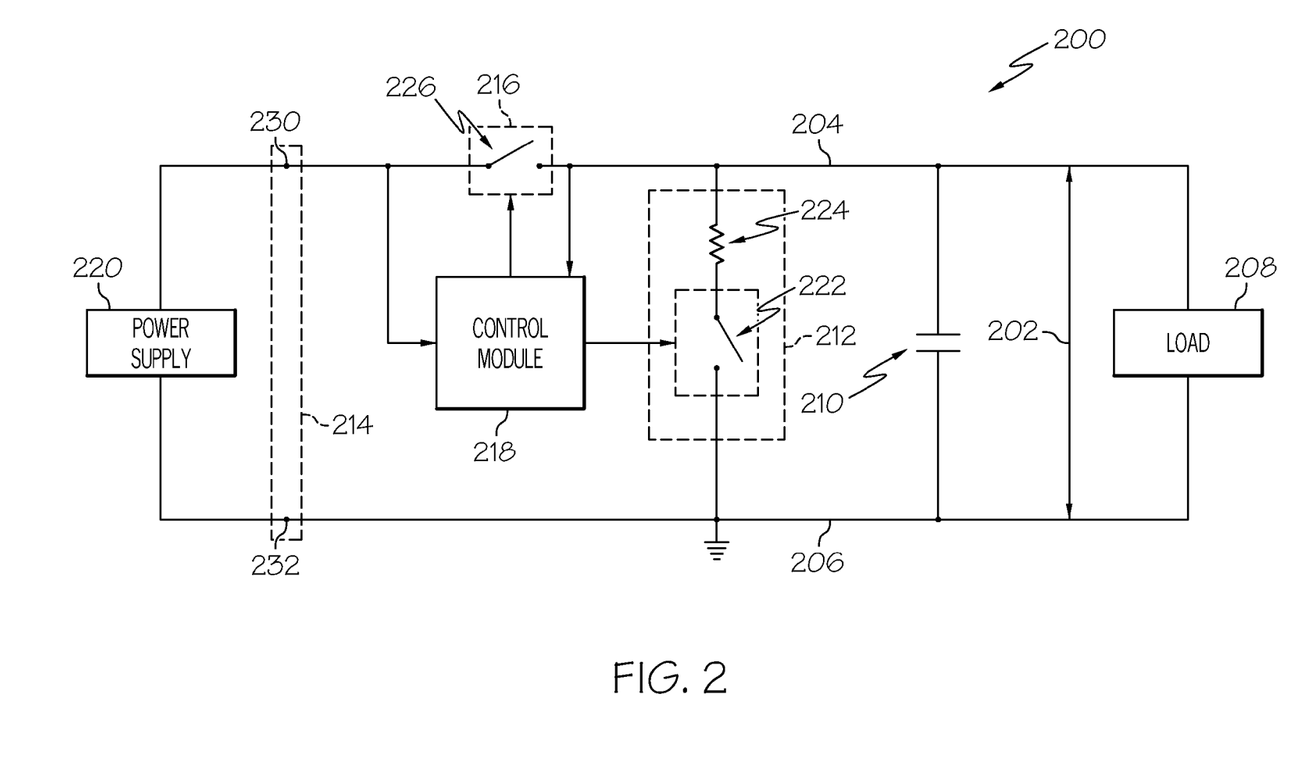
FIG. 2 is a schematic view of an exemplary electrical system suitable for use with the fluid infusion device of FIG. 1.

FIG. 2 depicts an exemplary embodiment of an electronics system 200 suitable for use in an electronic device, such as the infusion pump 100 of FIG. 1 or another portable medical device. In this regard, the electronics system 200 may be integrated on an electronics assembly that interfaces with one or more components of the infusion pump 100 (e.g., the drive motor assembly, the display element 106, the user interface 104, or the like) to support or otherwise control operation of the infusion pump 100. It should be appreciated that FIG. 2 is a simplified representation of an electronics system 200 for purposes of explanation and ease of description, and FIG. 2 is not intended to limit the subject matter described herein in any way.

The illustrated embodiment of electronics system 200 includes, without limitation, a voltage bus 202 including a pair of voltage rails 204, 206, an electrical load 208 coupled to the voltage bus 202, a capacitive element 210 coupled to the voltage bus 202, discharge circuitry 212 coupled to the voltage bus 202, an input interface 214, connection circuitry 216 coupled between the input interface 214 and a voltage rail 204 of the voltage bus 202, and a control module 218. As described in greater detail below, the control module 218 is coupled to the discharge circuitry 212 and the connection circuitry 216, and the control module 218 is configured to activate the discharge circuitry 212 to discharge the voltage bus 202 prior to activating the connection circuitry 216. After discharging the voltage bus 202, the control module 218 activates the connection circuitry 216 to provide an input power supply voltage from a power supply 220 coupled to the input interface 214 to the voltage bus 202.

In an exemplary embodiment, the voltage rails 204, 206 of the voltage bus 202 are each realized as a conductive element, such as conductive trace or wire, that routes a component of the bus voltage to the individual components of the electronics system 200. In this regard, a first voltage rail 204 corresponds to a positive reference (or supply) voltage for the electronics system 200 and the second voltage rail 206 corresponds to a negative reference (or ground) voltage for the electronics system 200, wherein the difference between the voltage of the first voltage rail 204 and the second voltage rail 206 corresponds to the bus voltage (i.e., the voltage of the voltage bus 202). For convenience, but without limitation, the first voltage rail 204 may be referred to herein as the supply voltage rail and the second voltage rail 206 may be referred to herein as the ground voltage rail.

In the illustrated embodiment, the electrical load 208 generally represents one or more electronic components that are coupled to the voltage bus 202 and are powered or otherwise operate off of the voltage bus 202. For example, depending on the embodiment, the electrical load 208 may include one or more processors, controllers, microprocessors, microcontrollers, digital signal processors, memory elements (e.g., flash memory, RAM memory, ROM memory, or the like), display drivers (e.g., LCD drivers) or other driver hardware, communications hardware (e.g., transmitters, receivers, transceivers, or the like), sensors, accelerometers, potentiometers, and the like. As described above, the supply voltage rail 204 is routed to the corresponding supply voltage inputs of the respective electronic components of the electrical load 208 to provide a supply voltage to the respective electronic components of the electrical load 208, while the ground voltage rail 206 is routed to the corresponding ground voltage inputs of the respective electronic components of the electrical load 208 to provide a common electrical ground to the electronic components of the electronics system 200. As described in greater detail below, in an exemplary embodiment, the electrical load 208 includes at least one electronic component configured to initiate a power-on reset and enter a known operating state when the bus voltage increases from a voltage level less than a lower power-on reset threshold voltage to a voltage level greater than an upper power-on reset threshold voltage. For example, an integrated circuit, such as a memory chip, a microcontroller, a microprocessor, or the like, coupled to the voltage bus 202 may initiate a power-on reset when the bus voltage increases from a voltage below 100 millivolts to a voltage exceeding 2.7 volts.

In an exemplary embodiment, the capacitive element 210 is realized as one or more capacitors coupled between the voltage rails 204, 206 of the voltage bus 202 to provide a desired capacitance configured electrically parallel to the electrical load 208. The capacitance of the capacitive element 210 helps to maintain a stable direct current (DC) bus voltage (i.e., a stable voltage differential between voltage rails 204, 206) and mitigates or otherwise absorbs voltage transients.

As illustrated, the discharge circuitry 212 is coupled between the voltage rails 204, 206 of the voltage bus 202 such that the discharge circuitry 212 is configured electrically parallel to the electrical load 208 and capacitive element 210. In the illustrated embodiment, the discharge circuitry 212 is realized as a switched resistance that includes a switching element 222 and a resistive element 224 configured electrically in series between the voltage rails 204, 206. In the illustrated embodiment, the resistive element 224 is connected between the supply voltage rail 204 and a first terminal of the switching element 222, and a second terminal of the switching element 222 is connected to the ground voltage rail 206. For example, in accordance with one embodiment, the switching element 222 may be realized as an n-type metal-oxide-semiconductor field-effect transistor (MOSFET), wherein the resistive element 224 is connected between the supply voltage rail 204 and the drain terminal, the source terminal is connected to the ground voltage rail 206, and the gate terminal is coupled to the control module 218 to allow the control module 218 to control when the transistor conducts current or is otherwise activated. In this regard, the control module 218 may utilize the voltage and/or power supplied by the power supply 220 at the positive node 230 to provide a gate voltage to operate the transistor in the saturation region or otherwise turn on the transistor to conduct current and discharge the voltage bus 202 regardless of the bus voltage to discharge the bus voltage to below the lower power-on reset threshold voltage (e.g., 100 mV) of the electrical load 208. It should be appreciated that in alternative embodiments, the resistive element 224 may be configured between the switching element 222 and the ground voltage rail 206, and the subject matter is not intended to be limited to any particular configuration or ordering of the resistive element 224 with respect to the switching element 222. The resistive element 224 may be realized as one or more resistors, wherein the magnitude of the resistance of the resistive element 224 is chosen to discharge the bus voltage to a voltage level below a lower power-on reset threshold voltage for an electronic component coupled to the voltage bus 202 within a predetermined amount of time (also referred to herein as a discharge time period), as described in greater detail below. In an exemplary embodiment, the discharge time period is less than an amount of time required to ensure or otherwise determine that the voltage at the positive node 230 of the input interface 214 is stable, as described in greater detail below. For example, in accordance with one embodiment, the resistive element 224 is chosen to discharge the voltage bus 202 below the lower power-on reset threshold voltage of 100 mV within a discharge time period of about 100 milliseconds. As used herein, discharging the voltage bus 202 should be understood as referring to the reduction of the bus voltage (e.g., the electrical potential between the voltage rails 204, 206, or alternatively, the electrical potential stored by the capacitive element 210 and/or electrical load 208) relative to its preceding electrical potential, and discharging the voltage bus 202 should not be construed as requiring that the bus voltage be reduced to zero.

The input interface 214 generally represents the physical interface (e.g., terminals, connectors, and the like) for coupling the electronics system 200 (or the electronics assembly having the electronics system 200 mounted thereon) to a power supply 220, such as a battery or battery pack. A first node 230 of the input interface 214 is electrically connected to the supply voltage rail 204 via the connection circuitry 216, as described in greater detail below, and a second node 232 of the input interface 214 is electrically connected to the ground voltage rail 206. For convenience, but without limitation, the first node 230 is alternatively referred to herein as the positive node of the input interface 214 and the second node 232 is alternatively referred to herein as the negative node of the input interface 214. The positive node 230 of the input interface 214 is configured to be coupled to or otherwise mate with a corresponding positive terminal of the power supply 220 and the negative node 232 of the input interface 214 is configured to be coupled to or otherwise mate with a corresponding negative terminal of the power supply 220. By virtue of the electrical connection between the ground voltage rail 206 and the negative terminal of the power supply 220 provided at the negative node 232 of the input interface 214, the power supply 220 and the components of the electronics system 200 are referenced to the same ground reference voltage, as will be appreciated in the art.

As illustrated in FIG. 2, the connection circuitry 216 includes a switching element 226 that is connected electrically in series between the supply voltage rail 204 and the positive node 230 of the input interface 214. In this regard, when the switching element 226 is activated, closed, or otherwise turned on, the positive terminal of the power supply 220 and/or positive node 230 of the input interface 214 is electrically connected to the supply voltage rail 204, which, in turn, results in the bus voltage being substantially equal to the input power supply voltage from the power supply 220 (i.e., the voltage difference between voltage rails 204, 206 is substantially equal to the voltage difference between nodes 230, 232). In this manner, the power supply 220 provides the input power supply voltage to the components of the electronics system 200 and/or electrical load 208 when the switching element 226 is activated, closed, or otherwise turned on. Conversely, when the switching element 226 is deactivated, opened, or otherwise turned off, the power supply 220 is effectively disconnected from the supply voltage rail 204 of voltage bus 202, and is thereby effectively disconnected from the electronics system 200.

In an exemplary embodiment, the control module 218 is realized as logic circuitry (e.g., logic gates, comparators, and the like) and/or other discrete hardware components configured to perform the functions described herein. However, in other embodiments, the control module 218 may be realized as a general purpose processor, a microprocessor, a controller, a microcontroller, a state machine, a content addressable memory, a digital signal processor, an application specific integrated circuit, a field programmable gate array, any suitable programmable logic device designed to perform the functions described herein. In this regard, the control module 218 may be implemented as a combination of computing devices, e.g., a combination of a digital signal processor and a microprocessor, a plurality of microprocessors, one or more microprocessors in conjunction with a digital signal processor core, or any other such configuration.

As described in greater detail below, in an exemplary embodiment, the control module 218 is coupled to the discharge circuitry 212 and the connection circuitry 216, and the control module 218 is configured to activate the discharge circuitry 212 (e.g., by providing signals to close or otherwise turn on the switching element 222) prior to activating the connection circuitry 216 to provide the input power supply voltage from the power supply 220 and/or input interface 214 to the voltage bus 202 and/or electronics system 200. As described in greater detail below, in accordance with one or more embodiments, the control module 218 is coupled to the positive node 230 of the input interface 214 and detects a connection condition when the voltage at the positive node 230 of the input interface 214 exceeds a first threshold voltage value. In other words, the control module 218 senses when a viable power supply 220 is connected across the input interface 214. In response to detecting a connection condition, the control module 218 activates the discharge circuitry 212 (i.e., by closing or turning on switching element 222) while maintaining the connection circuitry 216 deactivated (i.e., by maintaining switching element 226 turned off or otherwise in an open state) for the discharge time period to discharge the bus voltage to a voltage level below a lower power-on reset threshold voltage needed to initiate a power-on reset for one or more electronic components of the electrical load 208. After discharging the bus voltage to a voltage below the lower power-on reset threshold voltage, the control module 218 deactivates the discharge circuitry 212 (e.g., by providing signals to open or otherwise turn off switching element 222) and activates the connection circuitry 216 (e.g., by providing signals to close or otherwise turn on switching element 226) to provide the input power supply voltage from the power supply 220 to the voltage bus 202. In accordance with one or more embodiments, the control module 218 is coupled to the supply voltage rail 204, and in response to identifying a connection condition when the bus voltage is greater than an upper threshold voltage value, the control module 218 maintains the discharge circuitry 212 in its deactivated state (e.g., switching element 222 in an open state) while activating the connection circuitry 216 switching element 226 to provide the voltage of the power supply 220 to the voltage bus 202, as described in greater detail below.

Figure 3:
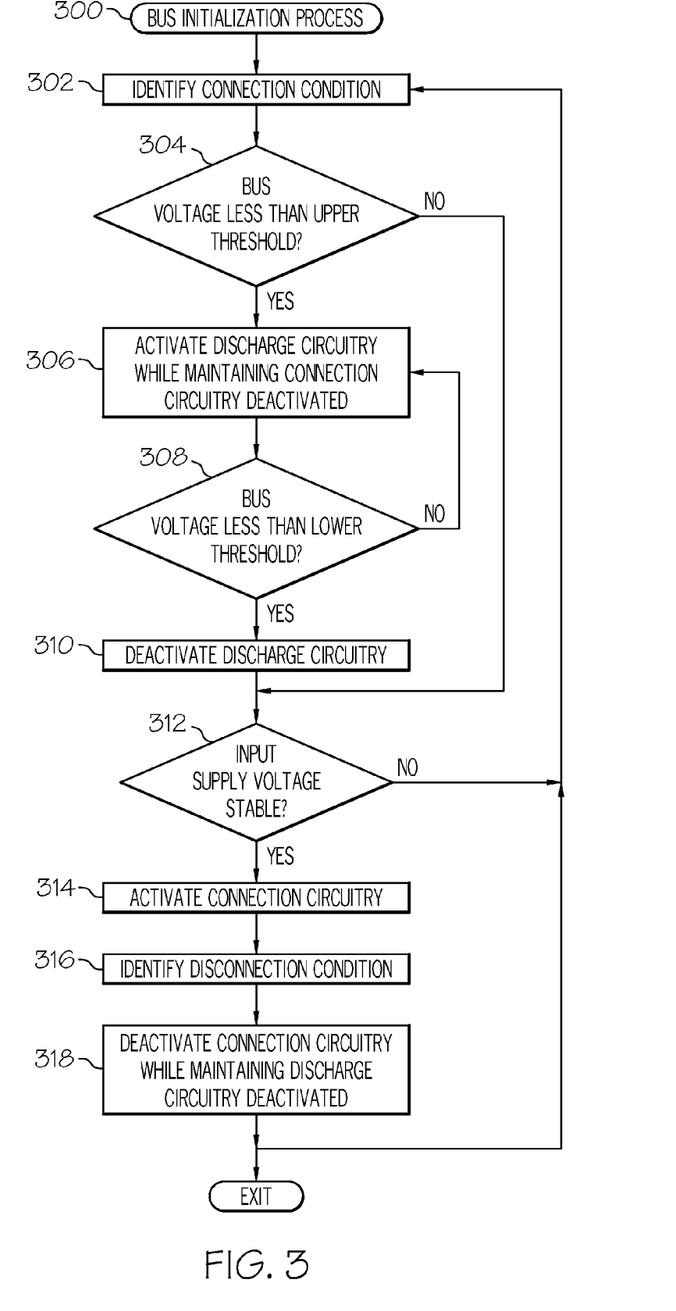
FIG. 3 is a flow diagram of an exemplary bus initialization process suitable for use with the electrical system of FIG. 2.

Referring now to FIG. 3, in an exemplary embodiment, an electronics system is configured to perform a bus initialization process 300 and additional tasks, functions, and/or operations as described below. The various tasks may be performed by hardware, firmware, software, or any combination thereof. For illustrative purposes, the following description may refer to elements mentioned above in connection with FIGS. 1-2. In practice, the tasks, functions, and operations may be performed by different elements of the described system, such as the discharge circuitry 212, the connection circuitry 216, the switching elements 222, 226, and/or the control module 218. It should be appreciated any number of additional or alternative tasks may be included, and may be incorporated into a more comprehensive procedure or process having additional functionality not described in detail herein.

Referring now to FIG. 3, and with continued reference to FIGS. 1-2, a bus initialization process 300 may be performed to initialize a voltage bus by discharging the bus voltage prior to electrically connecting the voltage bus to a power supply. In this regard, FIG. 2 depicts an initial state of the electronics system 200 prior to electrically connecting the power supply 220 to the voltage bus 202 and/or after electrically disconnecting the power supply from the voltage bus 202, as described in greater detail below. In this regard, when the power supply 220 is disconnected or otherwise decoupled from the input interface 214, the control module 218 deactivates the connection circuitry 216 and the discharge circuitry 212 (e.g., by opening, turning off, or otherwise deactivating the switching elements 222, 226) to disconnect the supply voltage rail 204 from the positive node 230 of the input interface 214.

In an exemplary embodiment, the bus initialization process 300 begins by detecting or identifying a connection condition (task 302). As used herein, a connection condition should be understood as an electrical characteristic or condition indicative of a desire to connect the supply voltage rail 204 of the voltage bus 202 to the input power supply voltage from the power supply 220 at the positive node 230 of the input interface 214.

For example, in accordance with one embodiment, the control module 218 identifies a connection condition in response to detecting that the power supply 220 is coupled to the input interface 214. In this regard, the control module 218 may monitor the voltage at the positive node 230 of the input interface 214 and identify a connection condition in response to detecting a voltage at the positive node 230 that indicates the power supply 220 is coupled to the input interface 214. The control module 218 may include or otherwise implement a comparator (or similar comparison circuitry) to compare the voltage at the positive node 230 to a first threshold voltage value that is indicative of a power supply 220 being coupled to the input interface 214. For example, the first threshold voltage value may chosen to be greater than one half of the nominal (or expected) bus voltage (or alternatively, one half of the nominal (or expected) input power supply voltage), such that the control module 218 detects a connection condition when the voltage at the positive node 230 is greater than one half of the nominal bus voltage and/or nominal input power supply voltage, thereby indicating the power supply 220 is connected to the input interface 214. In accordance with one embodiment, the first threshold voltage value may chosen to be equal to about ninety-five percent of the nominal bus voltage. For example, for a nominal bus voltage of about 3.2 V, the first threshold voltage value may be chosen to be equal to about 3.0 V. In this manner, the control module 218 may detect when the power supply 220 is inserted into or otherwise installed in the infusion pump 100.

In accordance with another embodiment, the control module 218 may identify a connection condition in response to receiving signals indicative of a desire to connect the electronics system 200 to the input power supply voltage from the power supply 220. For example, a user of the infusion pump 100 may manipulate the user interface 104 to signal a connection condition (e.g., by pressing a button or switch to indicate a desire to turn on or power on the infusion pump 100), wherein the control module 218 identifies a connection condition in response to receiving signals from the user interface 104 and/or the user of the infusion pump 100 indicative of the desire to connect the electronics system 200 to the input power supply voltage from the power supply 220.

In an exemplary embodiment, after detecting a connection condition, the bus initialization process 300 continues by determining, detecting, or otherwise identifying whether the bus voltage is greater than an upper threshold voltage value (task 304). In response to identifying the bus voltage is greater than the upper threshold voltage value, the bus initialization process 300 continues by maintaining the discharge circuitry 212 in its deactivated state and activating the connection circuitry when the input supply voltage is stable (tasks 312, 314), as described in greater detail below. In accordance with one or more embodiments, the upper threshold voltage value is chosen to be greater than or equal to a upper power-on reset threshold voltage for one or more electronic components of the electrical load 208, such that when the bus voltage is greater than the upper threshold voltage value, there is a sufficiently high likelihood that the one or more electronic components of the electrical load 208 are operating in a known operating state and the bus voltage does not need to be discharged to initiate a power-on reset. In another embodiment, the electronics system 200 and/or infusion pump 100 may include one or more secondary power supplies that provide standby power or backup power to the voltage bus 202 when the electronics system 200 is not connected to or otherwise receiving the input power supply voltage from the power supply 220. In this regard, the upper threshold voltage value may be chosen to be greater than or equal to a voltage value indicative of the voltage bus 202 being powered from a secondary power supply. In response to identifying the voltage of the supply voltage rail 204 is greater than the upper threshold voltage value, the control module 218 maintains the discharge circuitry 212 in the deactivated state (e.g., by maintaining switching element 222 opened or turned off) to prevent unnecessarily drawing current (or power) from the secondary power supply.

In response to determining the bus voltage is less than the upper threshold voltage value, in an exemplary embodiment, the bus initialization process 300 continues by activating the discharge circuitry while maintaining the connection circuitry deactivated until the bus voltage is below a lower threshold voltage value (tasks 306, 308, 310). In an exemplary embodiment, the lower threshold voltage value is less than the lower power-on reset threshold voltage for the one or more electronic components of the electrical load 208 and/or electronics system 200. In this regard, the bus voltage being less than the lower threshold voltage value indicates the bus voltage is sufficiently close to zero to cause one or more electronic components of the electrical load 208 to perform a power-on reset when the connection circuitry 216 is activated, as described in greater detail below.

Figure 4:
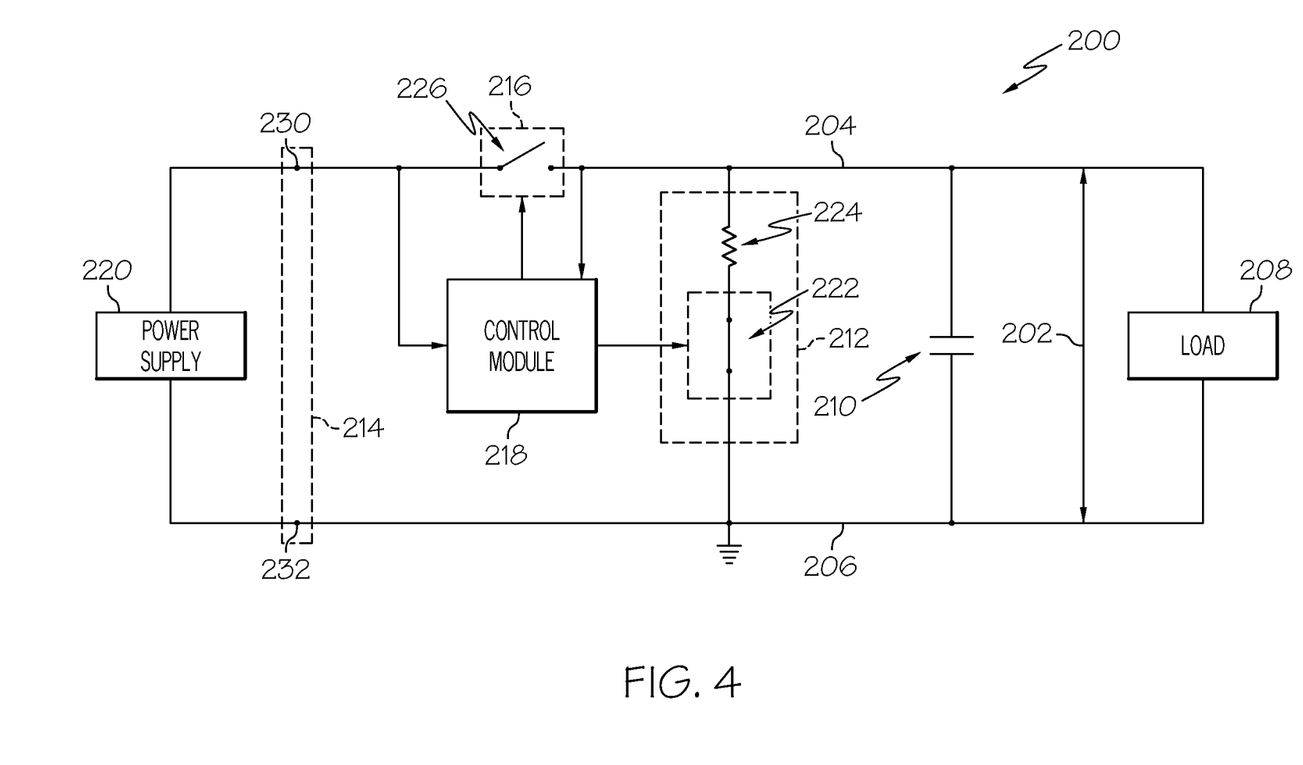
FIG. 4 is a schematic view of the electrical system of FIG. 2 after discharge circuitry is activated in accordance with the bus initialization process of FIG. 3.

As illustrated in FIG. 4, in response to identifying the connection condition when the voltage of the supply voltage rail 204 is less than the upper threshold voltage value, the control module 218 provides electrical signals to maintain the connection circuitry 216 deactivated (e.g., by opening or turning off switching element 226) while activating the discharge circuitry 212 (e.g., by closing or turning on switching element 222). When the discharge circuitry 212 is activated (i.e., when switching element 222 is closed), the resistive element 224 is effectively connected to the voltage bus 202 electrically parallel to the electrical load 208 and capacitive element 210, and thereby discharges the bus voltage stored by the capacitances of the electrical load 208 and/or capacitive element 210.

As described above, in accordance with one or more embodiments, the resistance of the resistive element 224 is chosen such that the bus voltage is consistently and reliably discharged to a voltage that is below the lower threshold voltage value within the discharge time period. In such embodiments, the control module 218 may initiate a timer or another suitable delay circuit in response to identifying a connection condition and activating the discharge circuitry 212, such that the control module 218, automatically deactivates the discharge circuitry 212 by turning off switching element 222 after the discharge time period (e.g., when the value of the timer meets or exceeds the discharge time period). In this manner, the control module 218 maintains the discharge circuitry 212 activated (e.g., by maintaining switching element 222 closed or turned on) for the discharge time period until the bus voltage is discharged below the lower threshold voltage value, and in such embodiments, the control module 218 need not monitor the voltage of the supply voltage rail 204 to ensure the bus voltage is discharged below the lower threshold voltage value. For example, as described above, the resistance of the resistive element 224 may be chosen to discharge the voltage bus 202 below 100 mV within 100 milliseconds, and the control module 218 may implement a timer such that the discharge circuitry 212 and/or switching element 222 is activated for 100 milliseconds in response to identifying a connection condition, and deactivated thereafter. In accordance with another embodiment, the control module 218 may monitor the voltage of the supply voltage rail 204, and deactivate the discharge circuitry 212 in response to detecting that the voltage of the supply voltage rail 204 (or bus voltage) is less than the lower threshold voltage value. For example, the control module 218 may implement a comparator or other comparison circuitry configured such that the control module 218 maintains the discharge circuitry 212 and/or switching element 222 activated until the bus voltage is less than 100 mV.

In an exemplary embodiment, the bus initialization process 300 continues by determining whether the voltage at the input interface is stable prior to activating the connection circuitry (tasks 312, 314). In this regard, the control module 218 monitors or otherwise samples the voltage at the positive node 230 at a predetermined amount of time after identifying the connection condition to ensure the voltage at the input interface 214 is stable. For example, in an exemplary embodiment, the control module 218 detects a connection condition when the voltage at the positive node 230 is greater than or equal to a first threshold voltage value, and the control module 218 determines or otherwise identifies that the input power supply voltage is stable when the voltage at the positive node 230 is greater than or equal to a first threshold voltage value the predetermined amount of time after the connection condition was initially detected. For example, as described above, in accordance with one embodiment, the resistive element 224 is chosen to discharge the voltage bus 202 below the lower power-on reset threshold voltage within a discharge time period of about 100 milliseconds, and the control module 218 is configured to sample the input power supply voltage 200 milliseconds after detecting the connection condition to determine whether the voltage at the positive node 230 of the input interface 214 is stable. In accordance with one embodiment, the amount of time required to determine that the input power supply voltage is stable is equal to the discharge time period. In this regard, in some embodiments, the control module 218 may activate the connection circuitry 216 in sync with or substantially simultaneously to deactivating the discharge circuitry 212 when the voltage at the positive node 230 remains greater than or equal to the first threshold voltage value after the discharge time period.

Figure 5:
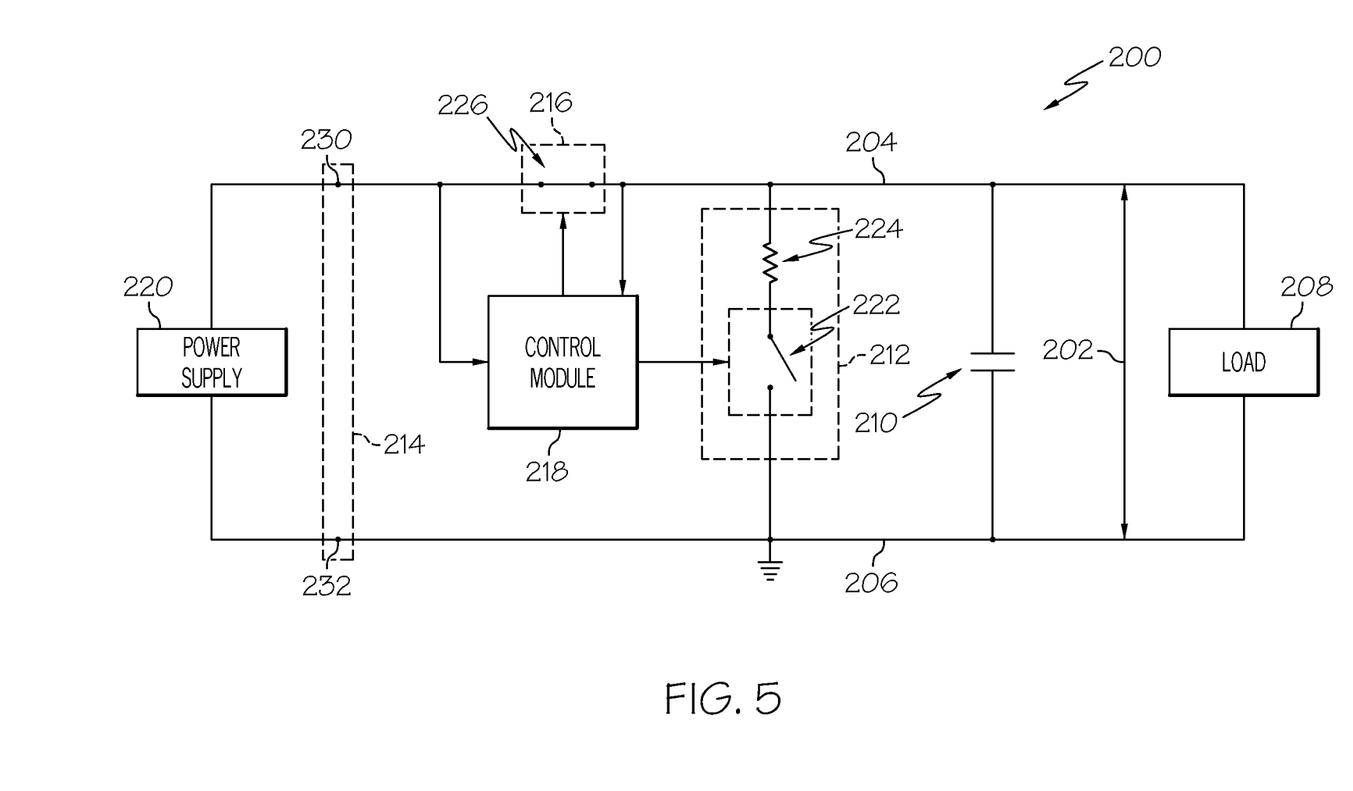
FIG. 5 is a schematic view of the electrical system of FIG. 2 after connection circuitry is activated in accordance with the bus initialization process of FIG. 3.

As illustrated in FIG. 5, after discharging the voltage bus below the lower threshold voltage value and determining that the input power supply voltage is stable, the control module 218 activates the connection circuitry 216 (e.g., by providing electrical signals to close or otherwise turn on switching element 226) to provide the input power supply voltage from the power supply 220 at positive node 230 to the supply voltage rail 204. In response to activating the connection circuitry 216 after discharging the voltage bus 202, the bus voltage increases from a voltage level below the lower power-on reset threshold voltage to the input power supply voltage, which is greater than the upper power-on reset threshold voltage, and thereby causes the one or more electrical components of the electrical load 208 and/or electronics system 200 to automatically initiate a power-on reset to a known operating state in response to the connection circuitry 216 being activated. In this manner, discharging the voltage bus in response to identifying a connection condition reduces the likelihood of one or more electrical components of the electrical load 208 and/or electronics system 200 operating in an unknown operating state when the connection circuitry 216 is activated.

Still referring to FIG. 3, and with continued reference to FIGS. 2 and 5, in an exemplary embodiment, after activating the connection circuitry, the bus initialization process 300 maintains the connection circuitry activated, and thereby maintains the input power supply voltage on the voltage bus, until identifying or otherwise detecting a disconnection condition (tasks 316, 318). As used herein, a disconnection condition should be understood as an electrical characteristic or condition indicative of a desire to disconnect or otherwise decouple the supply voltage rail 204 from the input power supply voltage from the power supply 220 at the positive node 230 of the input interface 214. For example, in accordance with one embodiment, the control module 218 monitors the positive node 230 of the input interface 214 and identifies a disconnection condition when a voltage at the positive node 230 is indicative of the power supply 220 being decoupled or otherwise disconnected from the input interface 214. As described above, the control module 218 may compare the voltage at the positive node 230 to a first threshold voltage value that is indicative of the power supply 220 being coupled to the input interface 214, and detect the disconnection condition when the voltage at the positive node 230 is less than the first threshold voltage value. After detecting the disconnection condition, the control module 218 deactivates the connection circuitry 216 to prevent the flow of current from the supply voltage rail 204 to the positive node 230 of the input interface 214, as illustrated by FIG. 2. In another embodiment, the control module 218 may identify the disconnection condition in response to receiving signals indicative of a disconnection condition. For example, a user of the infusion pump 100 may manipulate the user interface 104 to identify a disconnection condition (e.g., by pressing a button or switch to turn off or power off the infusion pump 100), wherein the control module 218 identifies a disconnection condition and deactivates the connection circuitry 216 in response to receiving signals from the user interface 104 and/or the user of the infusion pump 100 indicative of the desire to disconnect or otherwise decouple the power supply 220 from the voltage bus 202. In this regard, the power supply 220 remain electrically connected to the input interface 214 but disconnected from the voltage bus 202 by opening or otherwise turning off the switching element 226. The loop defined by tasks 302, 304, 306, 308, 310, 312, 314, and 316 may repeat as desired throughout operation of the electronics system 200 and/or infusion pump 100.

Referring now to FIGS. 2-5, in accordance with one exemplary embodiment, the nominal bus voltage is about 3.2 V, and the electrical load 208 includes a memory chip that includes one or more flash memory elements and one or more static random-access memory (SRAM) elements, wherein the memory chip is configured to initiate a power-on reset when the bus voltage increases from a voltage below 100 mV to a voltage exceeding 2.7 V, and the resistance of the resistive element 224 is chosen to discharge the voltage of the bus 202 to below 100 mV within a discharge time period of 100 milliseconds. In this embodiment, while the connection circuitry 216 is deactivated, the control module 218 may identify or otherwise detect a connection condition when the voltage at the positive node 230 of the input interface 214 is greater than about 3.0 V, thereby indicating the power supply 220 is connected to the input interface 214. After detecting the connection condition, the control module 218 determines, detects, or otherwise identifies whether the bus voltage is greater than the upper power-on reset threshold voltage of 2.7 V for the memory chip. When the bus voltage is greater than 2.7 V, the control module 218 maintains the discharge circuitry 212 in its deactivated state, however, in response to detecting or otherwise identifying the bus voltage is less than the upper power-on reset threshold voltage of 2.7 V, the control module 218 activates the discharge circuitry 212 and/or switching element 222 for at least 100 milliseconds while maintaining the connection circuitry 216 and/or switching element 226 deactivated to discharge the bus voltage to below the 100 mV lower power-on reset threshold voltage. As described above, the control module 218 may utilize the voltage and/or power at the positive node 230 of the input interface 214 to maintain the switching element 222 in its activated state even as the bus voltage decreases to 100 mV or less. At about 200 milliseconds after identifying the connection condition and activating the discharge circuitry 212, the control module 218 samples the input power supply voltage at the input interface 214, and when the input power supply voltage is still greater than 3.0 V, the control module 218 activates the connection circuitry 216 and/or switching element 226 while deactivating the discharge circuitry 212 and/or switching element 222 to connect the power supply 220 to the voltage bus 202. When the connection circuitry 216 and/or switching element 226 is activated, the bus voltage increases to a voltage greater than 3.0 V, which is greater than the 2.7 V upper power-on reset threshold voltage for the memory chip, thereby causing the memory chip to initiate a power-on reset into a known operating state.

Referring now to FIGS. 1-5, it should be noted that in an exemplary embodiment, the control module 218 does not activate the discharge circuitry 212 and/or switching element 222 in response to a disconnection condition, that is, the control module 218 maintains the discharge circuitry 212 deactivated in response to identifying a disconnection condition. In this regard, when the infusion pump 100 is powered off or the power supply 220 is removed from the infusion pump 100, if the infusion pump 100 includes a internal secondary (or backup) power supply, the secondary power supply continue providing standby power to components of the electronics system 200 without unnecessarily dissipating energy through the discharge circuitry 212. In this regard, in an exemplary embodiment, the discharge circuitry 212 is only activated in response to a connection condition (e.g., in response to detecting insertion of the power supply 220 into the infusion pump 100 or when the infusion pump 100 is powered on) to discharge the bus voltage to a sufficiently low voltage level prior to providing the input power supply voltage from the power supply 220 to the voltage bus 202 to ensure that electronics components coupled to the voltage bus 202 consistently and reliably initiate a power-on reset to a known operating state. As described above, the resistance of the resistive element 224 is preferably chosen to rapidly discharge the bus voltage to a sufficiently low voltage, such that the discharge circuitry 212 is only activated for a limited amount of time, thereby reducing the quiescent current for the electronics system 200. In this regard, when the power to the electronics system 200 is cycled off and on over a short period of time, the bus voltage may be consistently and reliably discharged whenever the bus voltage is below the upper power-on reset threshold voltage for one or more components of the electrical load 208 before the power supply 220 is coupled to the voltage bus 202, such that the electronic components of the electronics system 200 consistently and reliably initiate a power-on reset or otherwise operate in a known operating state every time the power supply 220 is connected to the voltage bus 202. In this manner, the bus voltage is precisely controlled and the electronic components of the electronics system 200 enter or otherwise operate in a known operating state whenever the power supply 220 is connected to the voltage bus 202, thereby reducing the likelihood of the electronic components of the electronics system 200 entering an unknown operating state.

To summarize, one advantage of the systems and methods described above is that the bus voltage may be discharged to a relatively low voltage (e.g., 100 mV or less) within a relatively short amount of time (e.g., 100 milliseconds or less), without unnecessarily consuming power from the voltage bus. For example, in some systems, a discharge resistor may be permanently connected in parallel to the voltage bus. A discharge resistor configured in this manner continuously draws current and/or power from the voltage bus, which is undesirable for battery-powered applications, and thus, requires a relatively large resistance be used to avoid excessive power consumption. However, this prevents the discharge resistor from rapidly discharging the bus voltage to a sufficiently low voltage (e.g., to below 100 mV within 100 milliseconds), and thus, may result in electronics components operating off the voltage bus to fail to initiate a power-on reset and enter an unknown operating state when the voltage and/or power supplied to the voltage bus is cycled rapidly (e.g., by disconnecting then reconnecting the power supply). Conversely, in other systems where the discharge resistor is switched between the voltage bus to discharge the voltage bus, the switching element is typically powered from the voltage bus. As a result, when the bus voltage falls below the threshold voltage of the switching element, the switching element ceases conducting current or otherwise becomes deactivated, thereby preventing the bus voltage from being discharge to relatively low voltages (e.g., 100 mV or less). Thus, these systems are also limited in their ability to discharge the bus voltage to a sufficiently low voltage (e.g., to below 100 mV), and may result in electronics components operating off the voltage bus to fail to initiate a power-on reset and enter an unknown operating state when the voltage and/or power supplied to the voltage bus is cycled rapidly.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. For example, the use of the electronics system 200 is not limited to the infusion pumps and drive systems described herein. Moreover, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
an input interface including a first node and a second node;
a voltage bus including a first voltage rail and a second voltage rail coupled to the second node, the voltage bus having a bus voltage between the first voltage rail and the second voltage rail;
discharge circuitry coupled electrically parallel between the first voltage rail and the second voltage rail;
connection circuitry coupled between the first voltage rail and the first node; and
a control module coupled to the connection circuitry and the discharge circuitry to:
identify a connection condition; and
in response to the connection condition:
activate the discharge circuitry in response to identifying the bus voltage is less than an upper threshold voltage prior to activating the connection circuitry; and
after activating the discharge circuitry, activate the connection circuitry after the bus voltage is discharged below a lower threshold voltage.

2. The system of claim 1, wherein the connection condition is indicative of a desire to activate the connection circuitry.

3. The system of claim 1, wherein a first time period after activating the discharge circuitry, the control module:
deactivates the discharge circuitry; and
activates the connection circuitry.

4. The system of claim 3, wherein the discharge circuitry discharges the bus voltage to a voltage less than the lower threshold voltage within the first time period prior to being deactivated.

5. The system of claim 1, wherein the control module deactivates the discharge circuitry after activating the discharge circuitry and prior to activating the connection circuitry.

6. The system of claim 1, wherein after activating the discharge circuitry, the control module:
deactivates the discharge circuitry in response to detecting the bus voltage is less than the lower threshold voltage; and
activates the connection circuitry after deactivating the discharge circuitry.

7. The system of claim 1, wherein:
the discharge circuitry is coupled electrically parallel between the first voltage rail and the second voltage rail; and
the connection circuitry includes a first switching element coupled between the first node and the first voltage rail.

8. The system of claim 7, wherein the control module:
identifies the connection condition by detecting a voltage at the first node of the input interface that is greater than a threshold voltage indicative of a power supply being coupled to the input interface; and
in response to detecting the voltage at the first node is greater than the threshold voltage:
activates the discharge circuitry for a first time period in response to identifying the bus voltage is less than the upper threshold voltage; and
after the first time period:
deactivates the discharge circuitry; and
activates the first switching element.

9. The system of claim 8, wherein:
the discharge circuitry includes:
a second switching element; and
a resistive element, the resistive element and the second switching element being configured electrically in series between the first voltage rail and the second voltage rail; and
the control module:
activates the discharge circuitry by activating the second switching element for the first time period in response to detecting the voltage at the first node is greater than the threshold voltage, the resistive element being configured electrically parallel between the first voltage rail and the second voltage rail when the second switching element is activated; and
deactivates the discharge circuitry by deactivating the second switching element after the first time period.

10. The system of claim 9, wherein the resistive element discharges the voltage bus to a voltage less than the lower threshold voltage within the first time period.

11. The system of claim 1, wherein the control module detects the connection condition when a voltage at the input interface is indicative of a power supply being coupled to the input interface.

12. The system of claim 1, wherein the lower threshold voltage corresponds to a lower power-on reset threshold voltage for an electronic component coupled to the voltage bus and the upper threshold voltage corresponds to an upper power-on reset threshold voltage for the electronic component.

13. The system of claim 12, wherein in response to identifying the connection condition, the control module activates the connection circuitry while maintaining the discharge circuitry in a deactivated state in response to identifying the bus voltage is greater than the upper threshold voltage.

14. A method for initializing a voltage bus having a bus voltage, the method comprising:
identifying a connection condition indicative of a desire to provide a power supply voltage from a power supply to the voltage bus; and
in response to identifying the connection condition:
discharging the voltage bus in response to identifying the bus voltage is less than an upper threshold voltage; and
after discharging the voltage bus until the bus voltage is less than a lower threshold voltage, activating connection circuitry coupled between the power supply and the voltage bus to provide the power supply voltage to the voltage bus.

15. The method of claim 14, wherein discharging the voltage bus comprises activating discharge circuitry coupled to the voltage bus in response to identifying the connection condition.

16. The method of claim 15, further comprising:
identifying a disconnection condition after activating the connection circuitry; and
in response to identifying the disconnection condition:
deactivating the connection circuitry; and
maintaining the discharge circuitry in a deactivated state.

17. The method of claim 14, wherein activating the connection circuitry comprises activating the connection circuitry after the bus voltage is less than the lower threshold voltage.

18. The method of claim 17, wherein discharging the voltage bus comprises:
activating discharge circuitry coupled to the voltage bus in response to identifying the connection condition; and
deactivating the discharge circuitry after the bus voltage is less than the lower threshold voltage.

19. The method of claim 18, wherein activating the connection circuitry comprises activating the connection circuitry after deactivating the discharge circuitry.

20. The method of claim 15, further comprising maintaining the discharge circuitry in a deactivated state prior to identifying the connection condition.

21. A method for initializing a voltage bus of a portable medical device, the voltage bus having a bus voltage, the method comprising:
identifying a connection condition; and
in response to identifying the connection condition:
when the bus voltage is greater than a first threshold voltage, activating connection circuitry coupled between a power supply and the voltage bus; and
when the bus voltage is less than the first threshold voltage:
discharging the voltage bus until the bus voltage is less than a second threshold voltage; and
activating the connection circuitry after the bus voltage is less than the second threshold voltage.

22. The method of claim 21, wherein discharging the voltage bus comprises activating discharge circuitry coupled to the voltage bus in response to identifying the connection condition.

23. The method of claim 22, wherein activating the connection circuitry when the bus voltage is greater than the first threshold voltage further comprises maintaining the discharge circuitry deactivated.

24. The method of claim 21, wherein identifying the connection condition comprises detecting insertion of the power supply into the portable medical device.

25. The method of claim 24, the connection circuitry being coupled between the voltage bus and an input interface to be coupled to the power supply, wherein detecting insertion of the power supply comprises detecting a voltage at the input interface that is greater than a third threshold voltage.

26. The method of claim 21, wherein identifying the connection condition comprises receiving signals indicative of a desire to turn on the portable medical device.

27. A portable medical device, comprising:
an interface to be coupled to a power supply;
an electronics system including:
a voltage bus having a bus voltage;
connection circuitry coupled between the voltage bus and the interface;
discharge circuitry coupled to the voltage bus; and
a control module coupled to the connection circuitry and the discharge circuitry, wherein the control module:
identifies a connection condition indicative of a desire to provide a power supply voltage from the power supply to the voltage bus; and
in response to identifying the connection condition:
activates the discharge circuitry for a first time period in response to identifying the bus voltage is less than an upper threshold voltage to discharge the bus voltage to less than a lower threshold voltage; and
thereafter activates the connection circuitry to provide the power supply voltage to the voltage bus.

28. The portable medical device of claim 27, further comprising an electronic component coupled to the voltage bus, wherein:
the lower threshold voltage comprises a lower power-on reset threshold voltage for the electronic component; and
the discharge circuitry discharges the bus voltage to the voltage less than the lower power-on reset threshold voltage for the electronic component within the first time period after being activated.

29. The portable medical device of claim 28, the upper threshold voltage comprising an upper power-on reset threshold voltage for the electronic component, wherein in response to identifying the connection condition when the bus voltage is greater than the upper power-on reset threshold voltage for the electronic component prior to activating the discharge circuitry, the control module activates the connection circuitry while maintaining the discharge circuitry deactivated.

30. The portable medical device of claim 27, wherein the control module is coupled to the interface, and the control module identifies the connection condition in response to detecting the power supply coupled to the interface.

31. The portable medical device of claim 27, wherein the control module is coupled to the interface, and the control module:
identifies the connection condition when a voltage at the interface is greater than a threshold voltage; and
activates the connection circuitry if the voltage at the interface is greater than the threshold voltage after the first time period.

* * * * *